US008346096B2

(12) United States Patent
Yazaki (10) Patent No.: US 8,346,096 B2
(45) Date of Patent: Jan. 1, 2013

(54) AMPLIFIER, OPTICAL RECEIVER CIRCUIT, OPTICAL MODULE AND DATA EXCHANGE SYSTEM

(75) Inventor: Toru Yazaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 378 days.

(21) Appl. No.: 12/840,856

(22) Filed: Jul. 21, 2010

(65) Prior Publication Data

US 2011/0020011 A1    Jan. 27, 2011

(30) Foreign Application Priority Data

Jul. 22, 2009    (JP) ................................. 2009-170711

(51) Int. Cl.
*H04B 10/00*    (2006.01)
(52) U.S. Cl. ......... 398/173; 330/308; 330/263; 330/264
(58) Field of Classification Search .................. 398/173; 330/263, 264, 269
See application file for complete search history.

(56) References Cited

U.S. PATENT DOCUMENTS

| 4,666,295 | A  | * | 5/1987  | Duvall et al.     | 356/5.09 |
| 6,307,660 | B1 | * | 10/2001 | Cordell et al.    | 398/209  |
| 7,471,074 | B2 | * | 12/2008 | Srinivasan        | 323/313  |
| 7,598,987 | B2 | * | 10/2009 | Desprez-Le Goarant et al. | 348/226.1 |
| 7,719,343 | B2 | * | 5/2010  | Burgener et al.   | 327/536  |
| 7,894,727 | B2 | * | 2/2011  | Inoue             | 398/202  |
| 7,952,397 | B2 | * | 5/2011  | Raghavan          | 327/108  |

FOREIGN PATENT DOCUMENTS

| JP | 59-115628 A   | 7/1984  |
| JP | 2001-326377 A | 11/2001 |

* cited by examiner

*Primary Examiner* — Patricia Nguyen
(74) *Attorney, Agent, or Firm* — Crowell & Moring LLP (57) ABSTRACT

When a conventional optical receiver circuit is used, it is difficult to achieve noise reduction or provide a multichannel capability due to a considerable circuit area increase. Disclosed is an amplifier for optical communications that includes a CMOS inverter, which has a PMOS transistor and an NMOS transistor; an input terminal, which inputs a signal into the CMOS inverter; an output terminal, which outputs a signal from the CMOS inverter; a power supply, which is connected to the CMOS inverter; a first element and a second element, which are respectively connected to the CMOS inverter; and two types of power supply paths, which are in opposite phase to each other.

9 Claims, 10 Drawing Sheets

AMPLIFIER, OPTICAL RECEIVER CIRCUIT, OPTICAL MODULE AND DATA EXCHANGE SYSTEM

INCORPORATION BY REFERENCE

This application claims the benefit of priority from Japanese Patent Application No. JP2009-170711 filed on Jul. 22, 2009, entitled "AMPLIFIER, OPTICAL RECEIVER CIRCUIT, OPTICAL MODULE, AND DATA EXCHANGE SYSTEM," the entire contents of which are incorporated herein by reference.

BACKGROUND OF THE INVENTION (1) Field of the Invention

The present invention relates to an amplifier capable of reducing the influence of power supply noise, an optical receiver circuit that uses the amplifier, an optical module that uses the amplifier, and a data exchange system that uses the amplifier.

(2) Description of the Related Art

In recent years, the traffic capacity required for a network has increased at an accelerated pace due to recent widespread use of the Internet. In the field of backplane transmission within the housing of a server, router, or other large-capacity data transmission device for a computer, telecommunication apparatus, or the like, it is anticipated that a communication speed of higher than 10 Gbps will be required for signal transmission within the housing of such a large-capacity data transmission device, and that conventional electrical-signal-based communication will be superseded by optical communication, which provides a higher communication speed. For commercialization of optical wiring for optical communication, it is necessary to use a transceiver circuit based on a CMOS process that can be integrated into a logic LSI. As a multichannel capability is essential, it is demanded that a circuit system capable of operating at a high speed with low area requirements be implemented.

Further, as the supply voltage is decreased due to the use of a miniaturized process, the signal level for communication is lowered. Consequently, the influence of power supply noise, which was insignificant in the past, is now nonnegligible. In recent years, therefore, it is also demanded that signal quality be prevented from being degraded by power supply noise.

An optical receiver circuit disclosed in Japanese Patent Application Laid-Open Publication No. 2001-326377 is formed by coupling a photodiode having a light-to-current conversion function to a transimpedance amplifier having a current-to-voltage conversion function in a hybrid manner. The photodiode is directly attached to a circuit board for the transimpedance amplifier by using a hybrid integration method based on wafer bonding. Further, a dedicated electrode pad is mounted on the transimpedance amplifier circuit board to electrically couple the photodiode to the transimpedance amplifier. The transimpedance amplifier is formed by connecting a shunt feedback impedance between the input and output of a circuit that is obtained by serially connecting an odd number of silicon CMOS inverters.

Disclosed in Japanese Patent Application Laid-Open Publication No. S59-115628 is a noise rejection method for use with a receiver that receives a target signal frequency within a frequency band where noise signals extensively exist. The receiver includes a signal receiver unit for tuning in to the target signal frequency and a signal receiver unit for tuning in to a frequency deviated from the target signal frequency and receiving only a noise signal. The output levels of noise signals included in outputs demodulated by the respective receiver units are equalized and set in opposite phase to each other. The noise output signals, which are in opposite phase to each other, then cancel each other to extract a target signal.

SUMMARY OF THE INVENTION

The circuit system for the optical receiver circuit disclosed in Japanese Patent Application Laid-Open Publication No. 2001-326377 is designed to provide an amplifier that is capable of operating at a high speed with low area requirements. However, it is difficult for this circuit system to inhibit power supply noise from being superimposed on a signal. The problem with the optical receiver circuit disclosed in Japanese Patent Application Laid-Open Publication No. 2001-326377 will now be described with reference to FIGS. 2A and 2B and Equation 1.

Figure 2A:
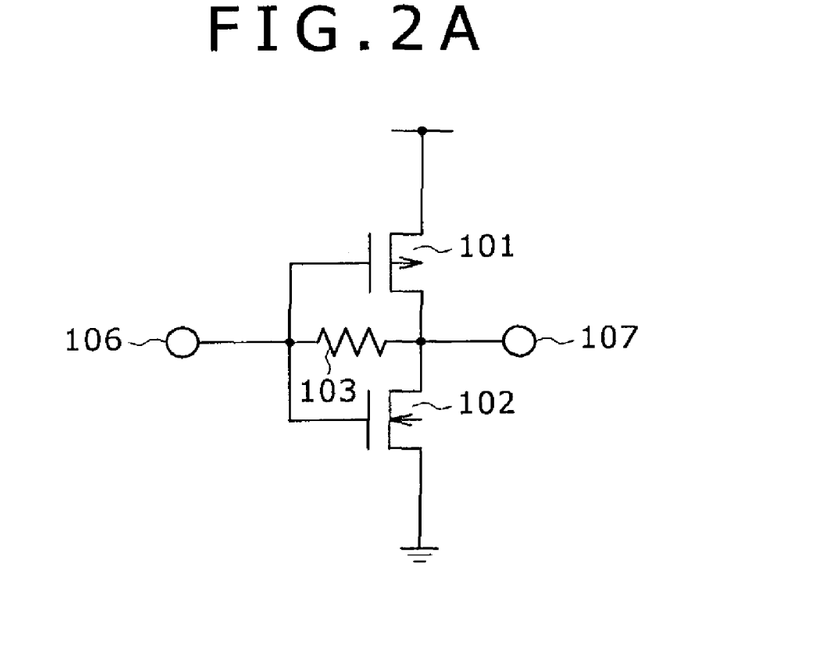
FIG. 2A is a circuit diagram illustrating a shunt feedback CMOS optical receiver circuit (amplifier circuit) disclosed in Japanese Patent Application Laid-Open Publication No. 2001-326377.
Figure 2B:
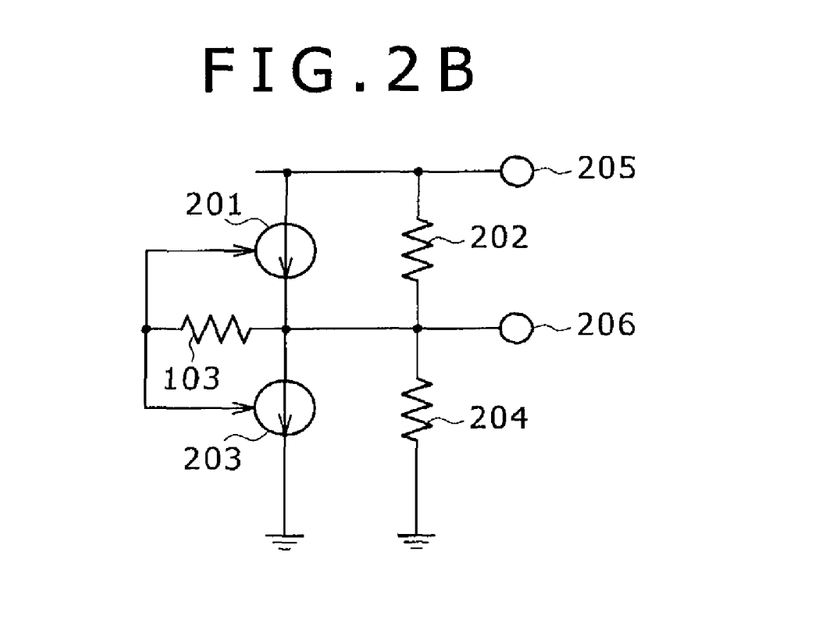
FIG. 2B is a diagram illustrating a small signal equivalent circuit that represents a signal path between an output terminal and a power supply for the shunt feedback CMOS optical receiver circuit that is disclosed in Japanese Patent Application Laid-Open Publication No. 2001-326377 and shown in FIG. 2A.

FIGS. 2A and 2B are diagrams illustrating parts of the amplifier described in Japanese Patent Application Laid-Open Publication No. 2001-326377. FIG. 2A is a diagram illustrating a shunt feedback CMOS optical receiver circuit (amplifier). FIG. 2B is a diagram illustrating a small signal equivalent circuit that represents a signal path between an output terminal and a power supply for the shunt feedback CMOS optical receiver circuit (amplifier) shown in FIG. 2A.

The shunt feedback CMOS optical receiver circuit (amplifier) shown in FIG. 2A includes a feedback resistor 103 and a CMOS inverter, which includes an PMOS transistor 101 and a NMOS transistor 102. In FIG. 2A, the reference numerals 106 and 107 denote an input terminal and an output terminal, respectively.

FIG. 2B shows a small signal equivalent circuit that represents a signal path between the output terminal and the power supply for the amplifier shown in FIG. 2A. A current source 201 is an equivalent current source for the PMOS transistor 101. A current source 203 is an equivalent current source for the NMOS transistor 102. The reference numerals 202 and 204 denote resistors that serve as transistor output impedances ro. When resistance provided by the feedback resistor 103 is R, the power supply noise is Vnoise, and a power supply noise component appearing at the output terminal 107 is Voutn, the equivalent current source 201 is expressed by the equation gm1·(Voutn−Vnoise) while the transconductance of the PMOS transistor 101 is gm1. While the transconductance of the NMOS transistor 102 is gm2, the equivalent current source 203 is expressed by the equation gm1·Voutn. Thus, the transfer function from a power supply terminal 205 to an output terminal 206 is expressed by Equation 1 below:

$$\frac{Voutn}{Vnoise} = \frac{1 + gm2 \cdot ro}{2 + (gm1 + gm2) \cdot ro} \qquad \text{Equation 1}$$

Referring to Equation 1, the amount of superimposed power supply noise can be reduced by decreasing the values gm2 and ro. However, the values gm2 and ro are constants determined by a process and cannot be decreased with ease. Therefore, it is difficult to reduce the noise.

The noise rejection method for use with a receiver that is disclosed in Japanese Patent Application Laid-Open Publication No. S59-115628 aims to eliminate noise from a signal. However, this method entails the use of two receiver circuits in order to achieve noise signal detection and noise rejection. In addition, this method also entails the use of a phase inverter and an adder circuit. Consequently, the use of this method considerably increases the circuit area and makes it difficult to provide a multichannel capability.

The present invention has been made in view of the above circumstances, and provides an optical receiver circuit that addresses the problems with the related art described above and reduces the amount of power supply noise superimposed on a signal with low area requirements.

Typical aspects of the present invention will be summarized below:

(1) According to a first aspect of the present invention, there is provided an amplifier for optical communications including a CMOS inverter, an input terminal, an output terminal, a power supply, a first element, a second element, a first power supply path, and a second power supply path. The CMOS inverter includes a PMOS transistor and an NMOS transistor. The input terminal inputs a signal into the CMOS inverter. The output terminal outputs a signal from the CMOS inverter. The power supply is connected to the CMOS inverter. The first and second elements are respectively connected to the CMOS inverter. The first and second power supply paths are in opposite phase to each other.

(2) According to a second aspect of the present invention, there is provided the amplifier for optical communications as described in the first aspect, wherein the first element is connected between the input terminal and the power supply; wherein the second element is connected between the input terminal and the output terminal; wherein the first power supply path supplies electrical power from the power supply to the output terminal through the PMOS transistor; and wherein the second power supply path supplies electrical power from the first element to the output terminal through the NMOS transistor.

The present invention provides an amplifier, an optical receiver circuit, an optical module, and a data exchange system that make it possible to reduce the amount of power supply noise superimposed on a signal with low area requirements.

BRIEF DESCRIPTION OF THE DRAWINGS

The present invention will become fully understood from the detailed description given hereinafter and the accompanying drawings, wherein.

DESCRIPTION OF PREFERRED EMBODIMENTS

Embodiments of the present invention will now be described with reference to the accompanying drawings. In all the drawings depicting the embodiments of the present invention, like elements are basically designated by the same reference numerals and will not be redundantly described.

First Embodiment

Figure 3A:
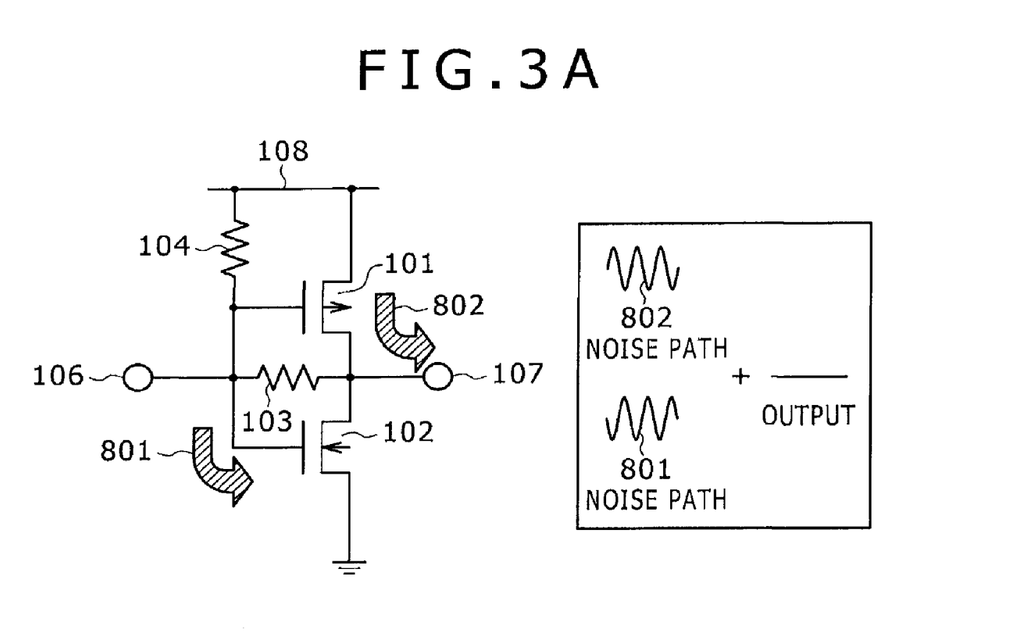
FIG. 3A is a schematic circuit diagram illustrating an example of the amplifier according to a first embodiment of the present invention.
Figure 3B:
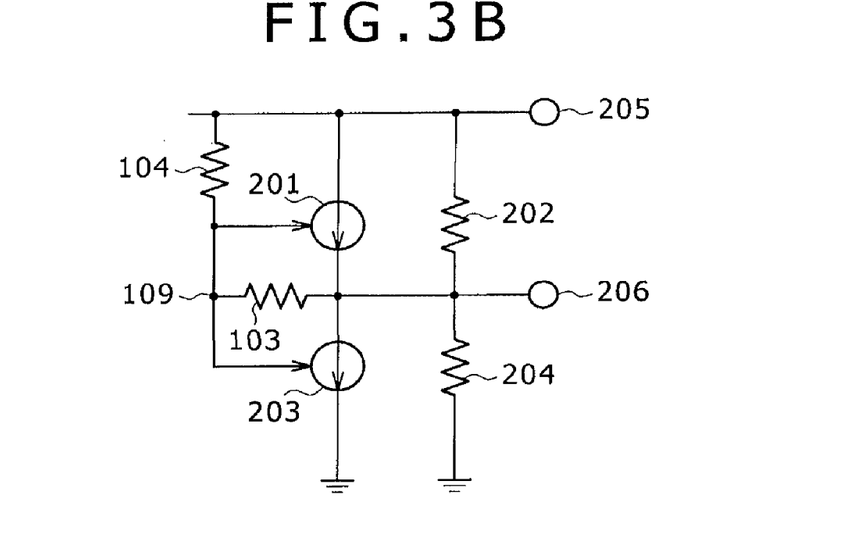
FIG. 3B is a diagram illustrating a small signal equivalent circuit that represents a signal path between an output terminal and a power supply for the amplifier shown in FIG. 3A.

FIGS. 3A and 3B show an example of an amplifier according to a first embodiment of the present invention. FIG. 3A is a schematic circuit diagram illustrating the amplifier according to the first embodiment of the present invention. FIG. 3B is a diagram illustrating a small signal equivalent circuit that represents a signal path between an output terminal and a power supply for the amplifier shown in FIG. 3A.

The amplifier shown in FIG. 3A includes a CMOS inverter, resistors 103, 104, an input terminal 106, an output terminal 107, and a power supply 108. The CMOS inverter includes a PMOS transistor 101 and an NMOS transistor 102. The resistor 103 is placed in a feedback path that is extended from the output terminal 107 of the CMOS inverter to the input terminal 106, and forms a shunt feedback signal amplifier. The resistor 104 is positioned between the input terminal 106 and the power supply 108. As the resistor 104 is positioned in such a manner, two paths are formed for transmitting power supply noise to the output terminal 107. One noise path 802 transmits power supply noise to the output terminal 107 through the PMOS transistor 101. The other noise path 801 transmits power supply noise to the output terminal 107 through the resistor 104 and then the NMOS transistor 102. The noise path 802 is of a common gate type that inputs power supply noise into the source of the PMOS transistor 101 and outputs the power supply noise to the drain. Therefore, the phase of the power supply noise is the same as the phase transmitted to the output terminal 107. On the other hand, the noise path 801 is of a common source type that inputs power supply noise into the gate of the NMOS transistor and outputs the power supply noise to the drain. Therefore, the phase of the power supply noise is opposite to the phase output to the output terminal 107. The power supply noise appearing at the output terminal 107 is reduced because the noise in the noise path 801 and the noise in the noise path 802, which are in opposite phase to each other, are added together to cancel each other.

The principle of above-mentioned noise reduction will now be described with reference to the use of a small signal equivalent circuit, which is a circuit analysis method. The small signal equivalent circuit, which is a signal path between the output terminal and the power supply of the amplifier shown in FIG. 3B, includes an equivalent current source 201 for the PMOS transistor 101, an equivalent current source 203 for the NMOS transistor 102, transistor output impedances ro 202, 204, a feedback resistor R 103, a resistor RL 104, a voltage Va 109, a power supply terminal 205, and an output terminal 206. When power supply noise is Vnoise, and the power supply noise present at the output terminal is Voutn, the equivalent current source 201 is expressed by the equation gm1·(Voutn−Va) while the transconductance of the PMOS transistor 101 is gm1. While the transconductance of the NMOS transistor 102 is gm2, the equivalent current source 203 is expressed by the equation gm1·Va. Thus, the transfer function from the power supply terminal 205 to the output terminal 206 is expressed by Equation 2 below:

$$\frac{Voutn}{Vnoise} = \frac{R \cdot ro2 - gm2 \cdot RL \cdot ro2}{ro1 \cdot ro2 + R(ro1 + ro2) + RL(ro1 + ro2 + gm1 \cdot ro1ro2 + gm2 \cdot ro1 \cdot ro2}} \approx \frac{gm1 \cdot R - gm2 \cdot RL}{RL(gm1 + gm2)}$$

Equation 2

Referring to Equation 2, the power supply noise (Voutn) component appearing at the output terminal 206 can be reduced by adjusting the value R or RL so that gm1·R=gm2·RL. In other words, when the resistor 104 does not exist, noise transmitted from the power supply 108 to the output terminal 107 (the noise transmitted through the noise path 802) is generated. However, when the resistor 104 is provided as shown in FIG. 3A, a signal path is formed to generate noise (the noise transmitted through the noise path 801) that is in opposite phase to the noise transmitted from the power supply 108 to the output terminal 107 (the noise transmitted through the noise path 802). Thus, the noise transmitted through the noise path 801 and the noise transmitted through the noise path 802, which are in opposite phase to each other, cancel each other. As a result, the noise transmitted from the power supply to a signal can be reduced apparently.

In the first embodiment, the resistor 104 is used as an element for generating opposite-phase noise. However, the element is not limited to the resistor 104. The same effect will be achieved as the effect produced by the first embodiment as far as the employed element is capable of generating noise that is in opposite phase to the noise transmitted through the noise path 802.

Consequently, the first embodiment of the present invention makes it possible to reduce the amount of power supply noise superimposed on a signal.

Figure 4:
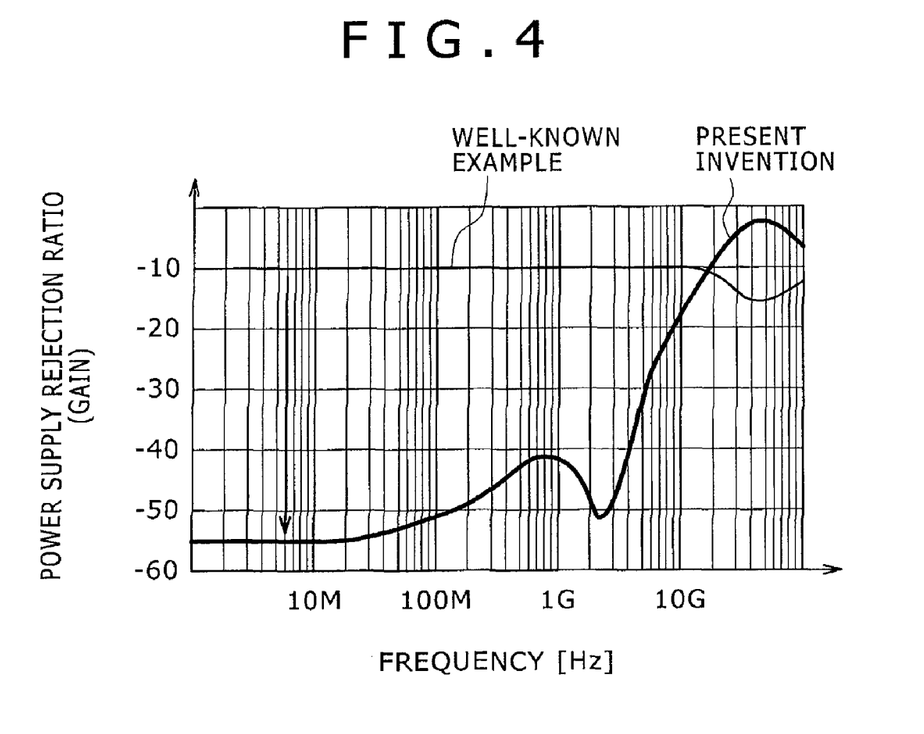
FIG. 4 is a diagram illustrating the result of comparison between an effect achieved by the amplifier according to the first embodiment of the present invention and an effect achieved by an amplifier disclosed in Japanese Patent Application Laid-Open Publication No. 2001-326377.

FIG. 4 is a diagram illustrating the effect achieved by the amplifier according to the first embodiment of the present invention. FIG. 4 shows the result of an analysis made with a circuit simulator to determine the relationship between frequency [Hz] and power supply rejection ratio (gain) [dB]. The figure indicates power supply rejection ratios that prevail at various frequencies when the amplifier disclosed in Japanese Patent Application Laid-Open Publication No. 2001-326377 and the amplifier according to the first embodiment of the present invention are used. A circuit simulator named "Spectre" was used during the analysis. The analysis was made at an analysis method setting of AC, a process CMOS setting of 90 nm, a supply voltage setting of 1.2 V, a resistor 103 setting of 300Ω, and a resistor 104 setting of 560Ω. As is obvious from the result of the analysis, when the frequency is not higher than approximately 10 GHz, the power supply noise derived from the amplifier according to the first embodiment of the present invention is considerably lower than the power supply noise derived from the amplifier disclosed in Japanese Patent Application Laid-Open Publication No. 2001-326377.

Figure 5A:
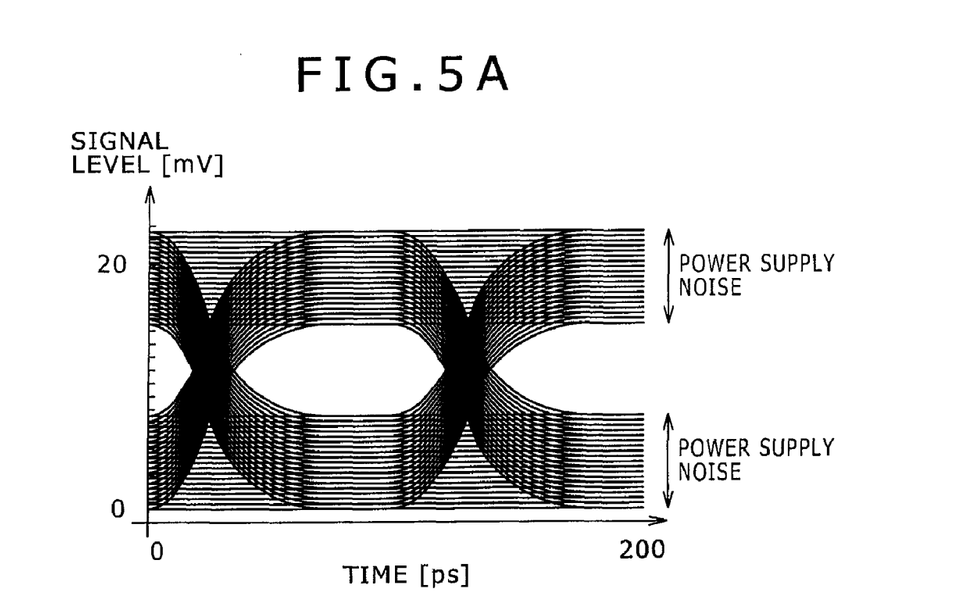
FIG. 5A shows an eye pattern that is obtained during the use of the amplifier disclosed in Japanese Patent Application Laid-Open Publication No. 2001-326377.
Figure 5B:
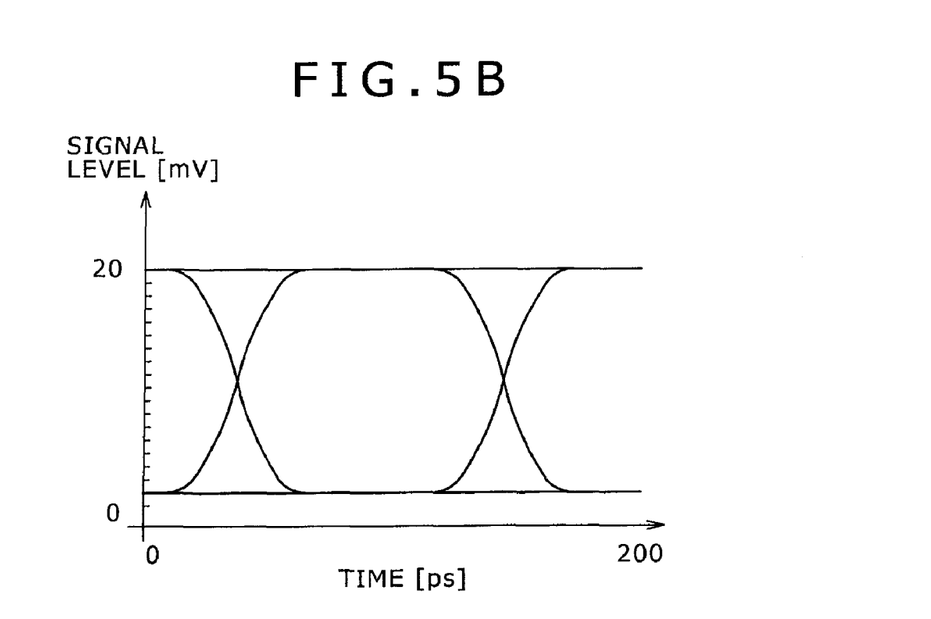
FIG. 5B shows an eye pattern that is obtained during the use of the amplifier according to the first embodiment of the present invention.

FIGS. 5A and 5B are diagrams illustrating the effect achieved by the amplifier according to the first embodiment of the present invention. FIG. 5A shows an eye pattern that is obtained during the use of the amplifier disclosed in Japanese Patent Application Laid-Open Publication No. 2001-326377. FIG. 5B shows an eye pattern that is obtained during the use of the amplifier according to the first embodiment of the present invention.

An eye pattern, also called an eye diagram, is a graphical display in which a number of signal waveform transitions are sampled and overlaid upon one another. If plural waveforms are overlaid upon one another at the same position, it means that their quality is high. If, on the contrary, the waveforms are displaced from each other, it means that their quality is low.

The waveforms in FIG. 5A are displaced from each other to indicate low quality. On the other hand, the waveforms in FIG. 5B are displayed at the same position to indicate high quality. It means that the amplifier according to the first embodiment of the present invention reduces the amount of superimposed power supply noise, thereby providing improved waveform quality.

Second Embodiment

Figure 6:
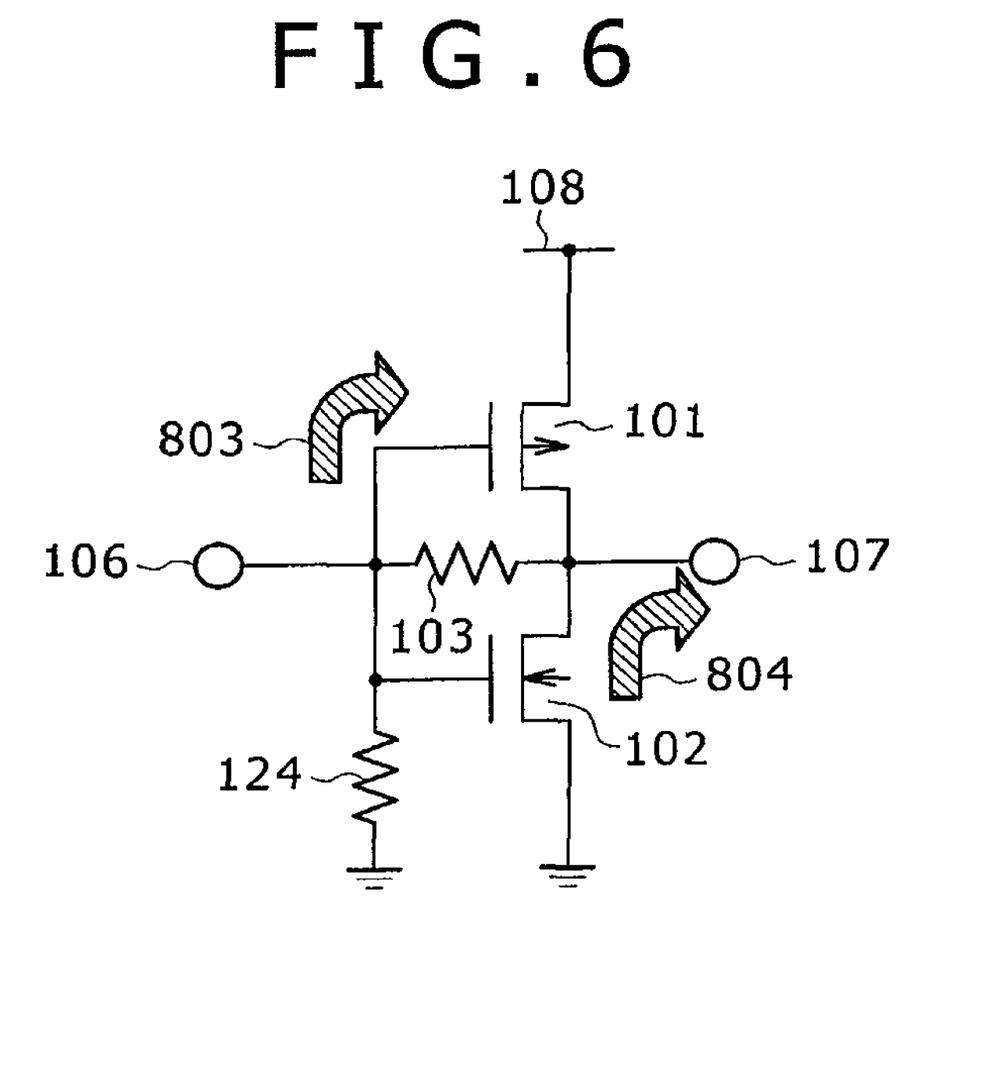
FIG. 6 is a schematic circuit diagram illustrating an example of the amplifier according to a second embodiment of the present invention.

FIG. 6 is a schematic circuit diagram illustrating an example of the amplifier according to a second embodiment of the present invention. The amplifier according to the second embodiment differs from the amplifier according to the first embodiment in that a resistor 124 for noise rejection is connected to a ground. The noise rejection resistor 124 is provided to form two noise paths that transmit ground noise to the output terminal 107. One noise path 804 transmits the ground noise to the output terminal 107 through the NMOS transistor 102. The other noise path 803 transmits the ground noise to the output terminal 107 through the resistor 124 and then the PMOS transistor 101. The noise path 804 is of a common gate type that inputs noise into the source of the NMOS transistor 102 and outputs the noise to the drain. Therefore, the phase of the ground noise is the same as the phase transmitted to the output terminal 107. On the other hand, the noise path 803 is of a common source type that inputs noise into the gate of the PMOS transistor and outputs the noise to the drain. Therefore, the phase of the ground noise is opposite to the phase output to the output terminal 107. The ground noise appearing at the output terminal 107, that is, the superimposed noise derived from the ground, is reduced because the noise in the noise path 803 and the noise in the noise path 804, which are in opposite phase to each other, are added together to cancel each other. This makes it possible to provide improved waveform quality. Further, the above-described effect can be achieved by a low-area amplifier.

Third Embodiment

Figure 7A:
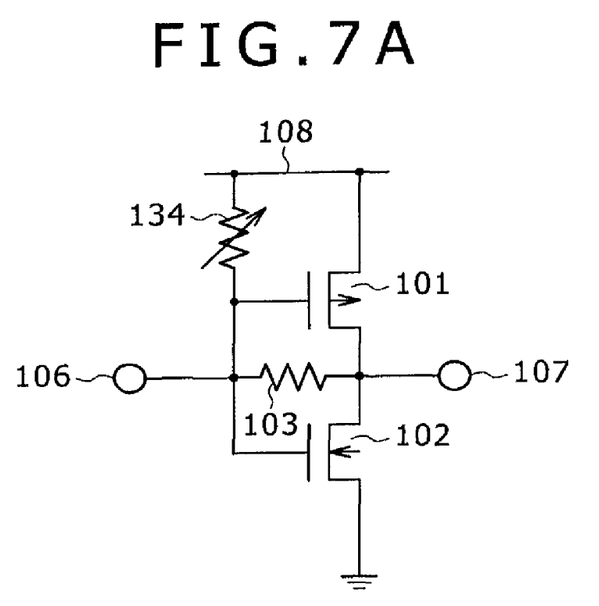
FIG. 7A is a diagram illustrating an example of the amplifier according to a third embodiment of the present invention.
Figure 7B:
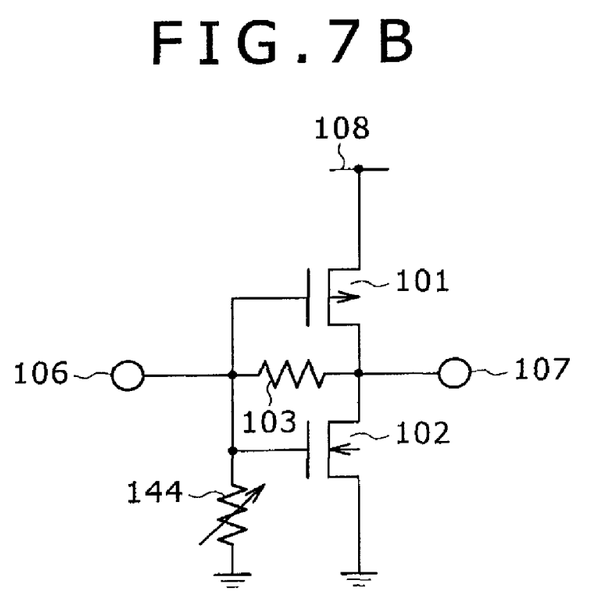
FIG. 7B is a diagram illustrating a modification of the amplifier according to the third embodiment of the present invention.

FIGS. 7A and 7B are diagrams illustrating examples of the amplifier according to a third embodiment of the present invention. More specifically, FIGS. 7A and 7B show modifications of the amplifier according to the third embodiment of the present invention.

The configuration of the amplifier shown in FIG. 7A is characterized in that the resistor 104 shown in FIG. 3A is replaced by a variable resistor 134. The configuration of the amplifier shown in FIG. 7B is characterized in that the resistor 124 shown in FIG. 6 is replaced by a variable resistor 144. In the third embodiment, a variable resistor is used instead of a resistor. The employed variable resistor 134 or variable resistor 144 is used for noise rejection. These variable resistors 134, 144 can change the amount of superimposed noise and provide adjustability even when variation occurs in the elements in the amplifier. Further, the above-described effect can be achieved with a low-area amplifier.

Fourth Embodiment

Figure 1:
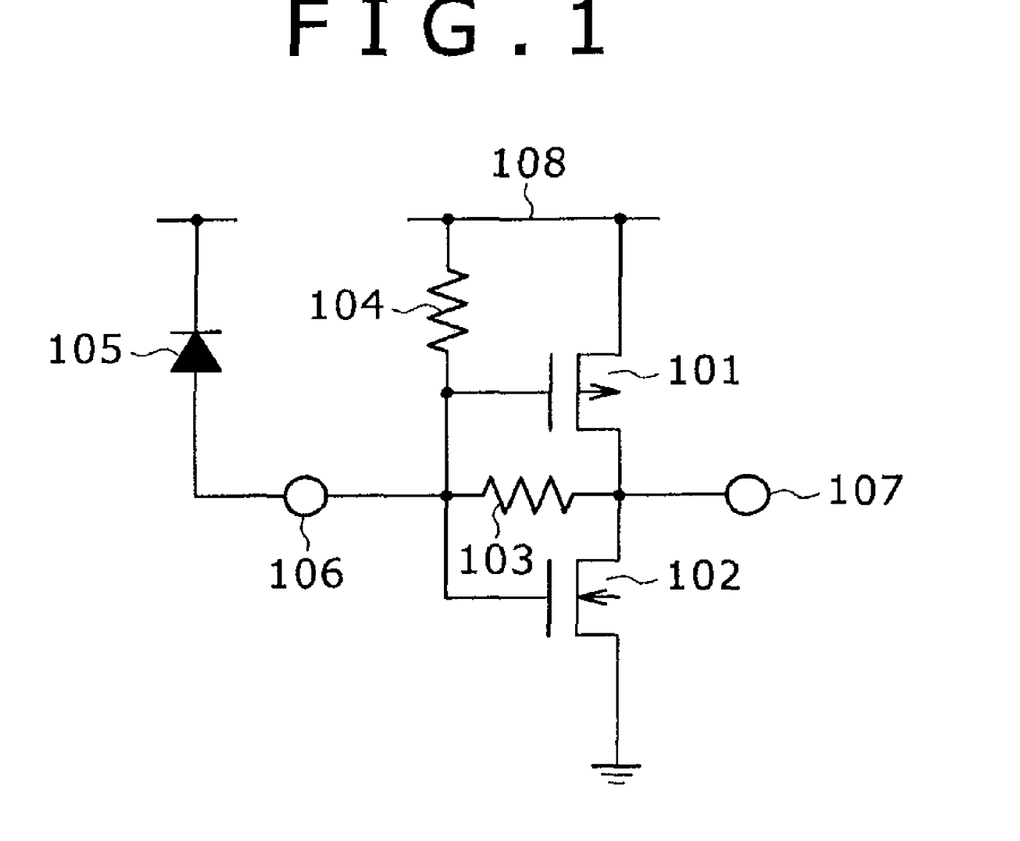
FIG. 1 is a schematic circuit diagram illustrating an example of an amplifier according to a fourth embodiment of the present invention.

FIG. 1 is a schematic circuit diagram illustrating an example of the amplifier according to a fourth embodiment of the present invention. The configuration of the fourth embodiment is characterized in that an opto-electronic converter 105 is connected to the input terminal 106 of the amplifier shown in FIG. 3A.

As the opto-electronic converter 105 is connected as describe above, an optical receiver circuit can reduce the power supply noise and provide improved waveform quality. Further, the above-described effect can be achieved with a low-area amplifier.

Fifth Embodiment

Figure 8:
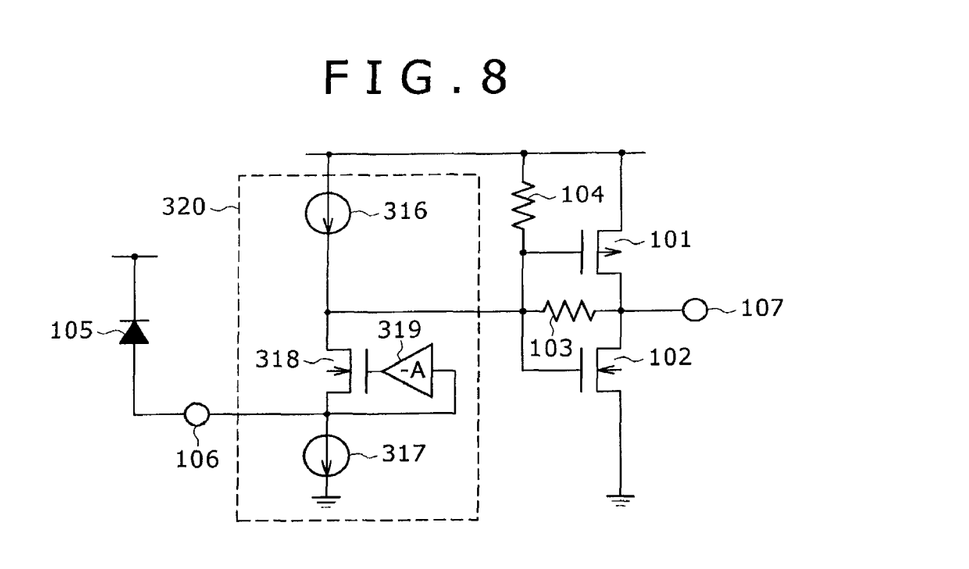
FIG. 8 is a schematic circuit diagram illustrating an example of an optical receiver circuit according to a fifth embodiment of the present invention.

FIG. 8 is a schematic circuit diagram illustrating an example of an optical receiver circuit according to a fifth embodiment of the present invention. The configuration shown in FIG. 8 is characterized in that the opto-electronic converter 105 and a current buffer 320 are added to the amplifier shown in FIG. 3A.

The current buffer 320 is connected between the input terminals of the amplifier that includes the PMOS transistor 101, the NMOS transistor 102, the resistors 103, 104, the output terminal 107, and the input terminals. The opto-electronic converter 105 is connected to the current buffer 320. The current buffer 320 in the fifth embodiment includes an NMOS transistor 318, an inverted amplifier 319, and current sources 316, 317.

It is expected that the amplifier according to the fifth embodiment will reduce the power supply noise to the same extent as the amplifier shown in FIGS. 3A and 3B, which depict the first embodiment. Further, the addition of the current buffer 320 provides a high-speed operation because it reduces the influence of cutoff frequency provided by the parasitic capacitance of a photodiode and the input impedance of the circuit according to the present embodiment.

Sixth Embodiment

Figure 9:
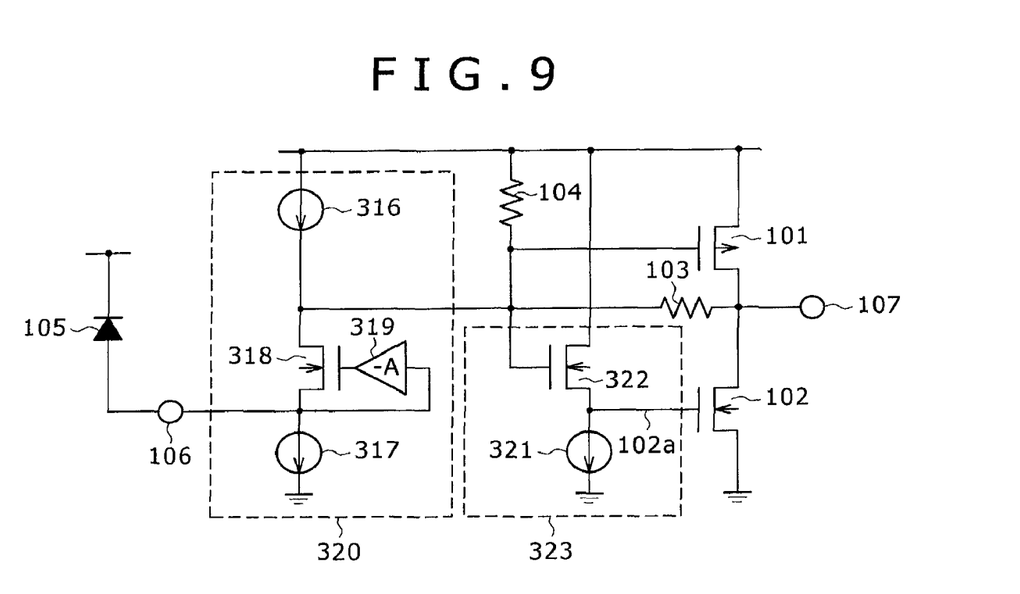
FIG. 9 is a schematic circuit diagram illustrating an example of the optical receiver circuit according to a sixth embodiment of the present invention.

FIG. 9 is a schematic circuit diagram illustrating an example of the optical receiver circuit according to a sixth embodiment of the present invention. The optical receiver circuit shown in FIG. 9 is characterized in that a level-shift circuit 323 and the current buffer 320 are connected to a gate terminal 102a of the amplifier shown in FIG. 1.

The level-shift circuit 323 includes an NMOS transistor 322 and a current source 321. The current buffer 320 includes the NMOS transistor 318, the inverted amplifier 319, and the current sources 316, 317, as is the case with the optical receiver circuit according to the fifth embodiment.

The addition of the level-shift circuit 323 makes it possible to adjust the DC level of the circuit according to the present embodiment. Further, the addition of the current buffer 320 provides a high-speed operation because it reduces the influence of cutoff frequency provided by the parasitic capacitance of a photodiode and the input impedance of the circuit according to the present embodiment.

Seventh Embodiment

Figure 10:
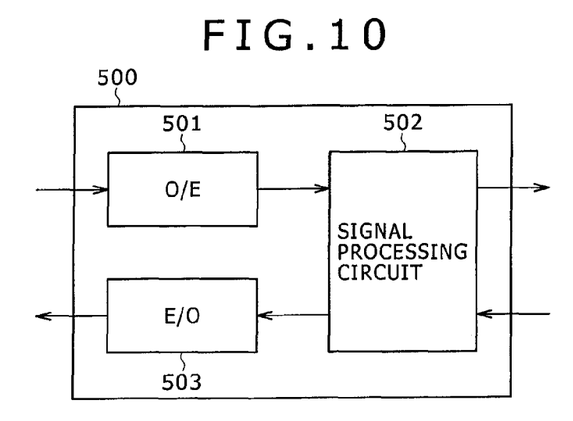
FIG. 10 is a configuration diagram illustrating an example of an optical module that uses the optical receiver circuit according to the fourth, fifth, and sixth embodiments of the present invention.

FIG. 10 is a configuration diagram illustrating an example of an optical module according to a seventh embodiment of the present invention, which uses the optical receiver circuit according to the fourth, fifth, and sixth embodiments of the present invention. The optical module 500 includes an optical receiver circuit 501, an optical transmitter circuit 503, and a signal processing circuit 502.

The optical receiver circuit 501 receives an optical signal input into the optical module 500, converts the optical signal to an electrical signal, and transmits the electrical signal to the signal processing circuit 502. The optical transmitter circuit 503 receives an electrical signal from the signal processing circuit 502, converts the electrical signal to an optical signal, and transmits the optical signal. The signal processing circuit 502 receives an input signal from the optical receiver circuit 501, processes the received signal, and outputs the processed signal. The signal processing circuit 502 also processes an externally input signal and transmits the processed signal to the optical transmitter circuit 503.

When the optical receiver circuit according to the fourth to sixth embodiments is applied to the optical module, it is possible to reduce the amount of power supply noise superimposed on a received signal. Further, when the optical receiver circuit into which the current buffer 320 is inserted is used, it is possible to reduce the influence of cutoff frequency provided by the parasitic capacitance of a photodiode and the input impedance of the circuit according to the present embodiment, thereby providing a high-speed operation. Furthermore, the use of the optical receiver circuit having the level-shift circuit 323 makes it possible to adjust the DC level. In addition, the above-described effect can be achieved with a low-area amplifier.

Eighth Embodiment

Figure 11:
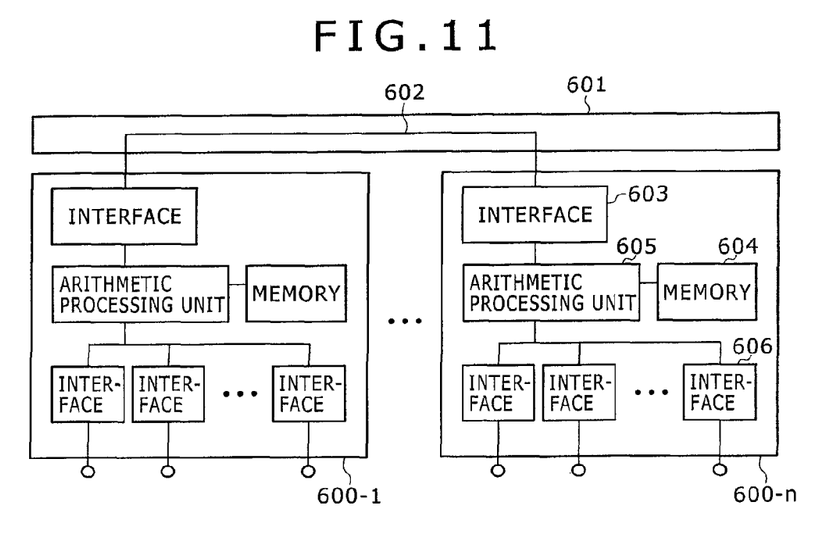
FIG. 11 is a configuration diagram illustrating an example of a data exchange system that uses the optical module according to a seventh embodiment of the present invention.

FIG. 11 is a configuration diagram illustrating an example of a data exchange system (router) according to an eighth embodiment of the present invention, which uses the optical module according to the seventh embodiment of the present invention.

The data exchange system includes plural communication devices 600-1, . . . , 600-n, a main board 601, a transmission medium 602, an interface 603, a memory 604, an arithmetic processing unit 605, and an optical module 606.

The plural communication devices 600-1, . . . , 600-n are respectively connected to an external network and capable of exchanging data signals with each other through the transmission medium 602, which uses optical wiring provided for the main board 601. Each communication device 600-n incorporates an optical-module-based interface 603, a memory 604, and an arithmetic processing unit 605.

The above-described configuration will improve the quality of a signal transmitted through the transmission medium. Thus, the transmission distance between the communication devices can be increased. This makes it possible to establish a larger-scale data exchange system capable of handling an increase in the number of connected networks.

Ninth Embodiment

Figure 12:
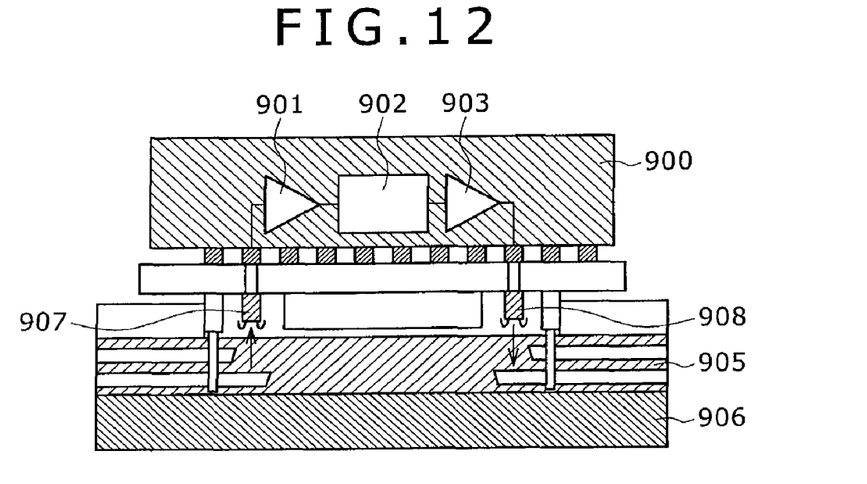
FIG. 12 is a configuration diagram illustrating an example of a product to which the optical module according to the seventh embodiment of the present invention is applied.

A ninth embodiment of the present invention will now be described with reference to FIG. 12. FIG. 12 is a configuration diagram illustrating an example of a product to which the optical module according to the seventh embodiment of the present invention is applied. In the configuration shown in FIG. 12, an optical signal path 905 on a circuit board 906 is connected to an optical transceiver LSI 900 through a photodiode 907 and a laser diode 908. An optical signal input through the optical signal path 905 is converted to an electrical signal by the photodiode 907, and then transmitted to the optical transceiver LSI 900. The optical transceiver LSI 900 includes a receiver 901, a signal processor 902, and a transmitter 903. An electrical signal input into the receiver 901 is processed by the signal processor 902. The transmitter 903 then drives the laser diode to convert the electrical signal to an optical signal.

When the optical receiver circuit according to the fourth, fifth, or sixth embodiment is applied to the optical module, it is possible to reduce the amount of power supply noise superimposed on a received signal. Further, when the optical receiver circuit into which the current buffer is inserted is used, it is possible to reduce the influence of cutoff frequency provided by the parasitic capacitance of a photodiode and the input impedance of the circuit according to the present embodiment, thereby providing a high-speed operation. Furthermore, the use of the optical receiver circuit having the level-shift circuit makes it possible to adjust the DC level. In addition, the above-described effect can be achieved with a low-area amplifier.

Tenth Embodiment

Figure 13:
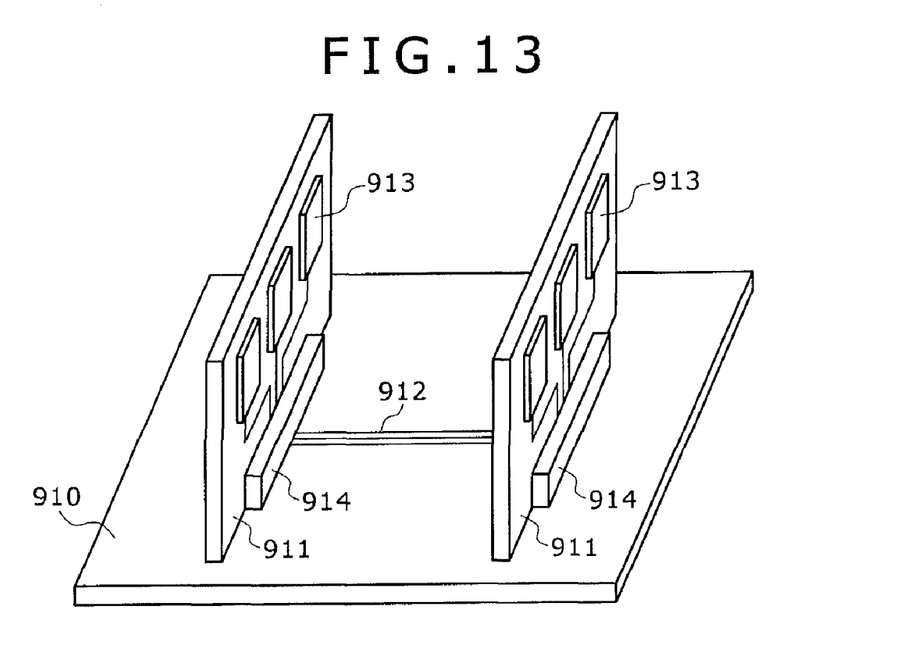
FIG. 13 is a configuration diagram illustrating an example of optical backplane transmission provided by the optical module according to a ninth embodiment of the present invention.

A tenth embodiment of the present invention will now be described with reference to FIG. 13. FIG. 13 is a configuration diagram illustrating an example of optical backplane transmission provided by the optical module according to the ninth embodiment of the present invention. A daughterboard 911 connected to a backplane 910 in a server or router is connected with an optical signal path 912 on the backplane 910. The optical signal path 912 is connected to the optical module 913 on the daughterboard through a connector 914.

When the optical module according to the ninth embodiment is applied to backplane transmission, it is possible to reduce the amount of superimposed power supply noise. Further, when the optical receiver circuit into which the current buffer is inserted is used, it is possible to reduce the influence of cutoff frequency provided by the parasitic capacitance of a photodiode and the input impedance of the circuit according to the present embodiment, thereby providing a high-speed operation. Furthermore, the use of the optical receiver circuit having the level-shift circuit makes it possible to adjust the DC level. In addition, the above-described effect can be achieved with a low-area amplifier.

It should be understood by those skilled in the art that various modifications, combinations, sub-combinations, and alterations may occur depending on design requirements and other factors insofar as they are within the scope of the appended claims or the equivalents thereof.

What is claimed is:

1. An amplifier for optical communications comprising:
   a CMOS inverter that includes a PMOS transistor and an NMOS transistor;
   an input terminal that inputs a signal into the CMOS inverter;
   an output terminal that outputs a signal from the CMOS inverter;
   a power supply that is connected to the CMOS inverter;
   a first element and a second element that are respectively connected to the CMOS inverter; and
   a first power supply path and a second power supply path that are in opposite phase to each other.

2. The amplifier for optical communications according to claim 1,
   Wherein: the first element is connected between the input terminal and the power supply;
   the second element is connected between the input terminal and the output terminal;
   the first power supply path supplies electrical power from the power supply to the output terminal through the PMOS transistor; and
   the second power supply path supplies electrical power from the first element to the output terminal through the NMOS transistor.

3. The amplifier for optical communications according to claim 1,
   Wherein: the first element is connected to a ground;
   the second element is connected between the input terminal and the output terminal;
   the first power supply path supplies electrical power to the output terminal through the NMOS transistor; and
   the second power supply path supplies electrical power from the first element to the output terminal through the PMOS transistor.

4. The amplifier for optical communications according to any one of claims 1 to 3, wherein the first and second elements are resistors.

5. The amplifier for optical communications according to claim 4, wherein the first resistor is variable.

6. An optical receiver circuit comprising:
   an opto-electronic converter that is connected to the input terminal of the amplifier for optical communications according to any one of claims 1 to 5.

7. An optical receiver circuit comprising:
   a current buffer and an opto-electronic converter that are connected to the input terminal of the amplifier for optical communications according to any one of claims 1 to 5.

8. An optical receiver circuit comprising:
   a level-shift circuit, a current buffer, and an opto-electronic converter that are connected to the input terminal of the amplifier for optical communications according to any one of claims 1 to 5.

9. An optical module comprising:
   the optical receiver circuit according to claim 8;
   a signal processing circuit that processes a signal input from the optical receiver circuit; and
   an optical transmitter circuit that converts a signal received from the signal processing circuit and transmits the converted signal.

* * * * *